(12) United States Patent
Jaggers et al.

(10) Patent No.: US 12,740,018 B2
(45) Date of Patent: Sep. 15, 2026

(54) COMPONENT COOLER WITH MULTIPLE FLUID PATHS

(71) Applicant: ADVANCED MICRO DEVICES, INC., Santa Clara, CA (US)

(72) Inventors: Christopher M. Jaggers, Austin, TX (US); Robert Edward Radke, Austin, TX (US); Christopher M. Helberg, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 581 days.

(21) Appl. No.: 17/956,793

(22) Filed: Sep. 29, 2022

(65) Prior Publication Data

US 2024/0111269 A1 Apr. 4, 2024

(51) Int. Cl.
*H05K 7/20* (2006.01)
*G06F 1/20* (2006.01)

(52) U.S. Cl.
CPC ............. *H05K 7/2039* (2013.01); *G06F 1/20* (2013.01); *G05B 2219/45006* (2013.01); *G05B 2219/49216* (2013.01)

(58) Field of Classification Search
CPC .......... G05B 19/416; G06F 1/20; H05K 7/20; H05K 7/2039
See application file for complete search history.

(56) References Cited

U.S. PATENT DOCUMENTS 4,607,492 A 8/1986 Demus et al.
6,084,771 A 7/2000 Ranchy et al.
6,542,365 B2 4/2003 Inoue
6,845,012 B2 1/2005 Ohkouchi
7,027,302 B2 4/2006 Inoue
7,106,592 B2 9/2006 Inoue et al.
7,240,722 B2 7/2007 Lai et al.
7,248,478 B2 7/2007 Inoue
7,250,674 B2 7/2007 Inoue
7,298,618 B2 11/2007 Campbell et al.
7,400,504 B2 7/2008 Campbell et al.
7,408,776 B1 8/2008 Campbell et al.
7,591,302 B1 9/2009 Lenehan et al.
7,639,498 B2 12/2009 Campbell et al.
(Continued)

FOREIGN PATENT DOCUMENTS

DE 202008013995 U1 12/2008
EP 0498753 A2 8/1992
(Continued)

OTHER PUBLICATIONS

International Search Report and Written Opinion, PCT/US2023/073736, Dec. 14, 2023, 11 pages.
(Continued)

*Primary Examiner* — Mark A Connolly

(57) ABSTRACT

An apparatus for component cooling includes a first heat transfer element configured to be thermally coupled to a heat-generating component and a second heat transfer element configured to be thermally coupled to the heat-generating component. A manifold is configured to receive a single fluid flow of a heat transfer medium and split the single fluid flow into a first split fluid flow provided to the first heat transfer element and a second split fluid flow provided to the second heat transfer element.

20 Claims, 14 Drawing Sheets

(56) References Cited

U.S. PATENT DOCUMENTS

| | | | |
|---|---|---|---|
| 7,830,664 B2 | 11/2010 | Campbell et al. | |
| 8,668,189 B2 | 3/2014 | Guthrie | |
| 9,157,687 B2 * | 10/2015 | Schon | H10F 77/63 |
| 9,313,919 B2 | 4/2016 | Aoki et al. | |
| 10,602,640 B1 * | 3/2020 | Tsai | H05K 7/20254 |
| 10,694,638 B1 | 6/2020 | Lin et al. | |
| 10,775,861 B2 | 9/2020 | North et al. | |
| 11,547,022 B2 | 1/2023 | Gao | |
| 2003/0183269 A1 | 10/2003 | Maeda et al. | |
| 2006/0001140 A1 | 1/2006 | Lee et al. | |
| 2006/0090474 A1 | 5/2006 | Sauciuc et al. | |
| 2006/0278372 A1 | 12/2006 | Lai et al. | |
| 2007/0034356 A1 * | 2/2007 | Kenny | F04B 17/00 257/E23.098 |
| 2007/0074853 A1 | 4/2007 | Popovich | |
| 2007/0091570 A1 | 4/2007 | Campbell et al. | |
| 2007/0234740 A1 | 10/2007 | Lee et al. | |
| 2008/0052428 A1 | 2/2008 | Liang et al. | |
| 2008/0084668 A1 | 4/2008 | Campbell et al. | |
| 2008/0174962 A1 * | 7/2008 | Belady | G06F 1/20 361/699 |
| 2008/0184710 A1 | 8/2008 | DeVilbiss | |
| 2008/0259567 A1 | 10/2008 | Campbell et al. | |
| 2010/0101756 A1 | 4/2010 | Chu et al. | |
| 2011/0320055 A1 | 12/2011 | Yamachi | |
| 2013/0027884 A1 * | 1/2013 | Campbell | H05K 7/20818 165/104.21 |
| 2013/0056186 A1 * | 3/2013 | Schalansky | F28F 3/086 165/137 |
| 2014/0231057 A1 * | 8/2014 | Schalansky | F28F 9/02 165/169 |
| 2014/0237815 A1 | 8/2014 | Lau et al. | |
| 2015/0062824 A1 | 3/2015 | Hyun et al. | |
| 2015/0233647 A1 | 8/2015 | Quisenberry et al. | |
| 2016/0033974 A1 | 2/2016 | North et al. | |
| 2016/0334845 A1 | 11/2016 | Mittal et al. | |
| 2017/0038805 A1 | 2/2017 | Chun | |
| 2017/0191709 A1 | 7/2017 | Chen et al. | |
| 2018/0004259 A1 | 1/2018 | Kulkarni et al. | |
| 2018/0206365 A1 | 7/2018 | Norton et al. | |
| 2020/0363104 A1 | 11/2020 | MacDonald et al. | |
| 2021/0045254 A1 | 2/2021 | Zhang et al. | |
| 2021/0084791 A1 | 3/2021 | Bucher | |
| 2022/0007541 A1 | 1/2022 | Shaw et al. | |
| 2022/0113757 A1 | 4/2022 | Yan et al. | |
| 2022/0167526 A1 | 5/2022 | Xu et al. | |
| 2022/0214730 A1 | 7/2022 | Navarro et al. | |
| 2022/0256684 A1 | 8/2022 | Gao | |
| 2022/0369517 A1 | 11/2022 | Gao | |
| 2023/0009853 A1 | 1/2023 | Kim et al. | |
| 2023/0083995 A1 | 3/2023 | Wang et al. | |
| 2023/0096875 A1 * | 3/2023 | Edmunds | H05K 7/20772 361/689 |
| 2023/0348106 A1 | 11/2023 | Berthelet et al. | |
| 2024/0057296 A1 | 2/2024 | Gary et al. | |
| 2024/0111343 A1 | 4/2024 | Pratapgarhwala et al. | |
| 2024/0111344 A1 | 4/2024 | Austin et al. | |
| 2024/0114646 A1 | 4/2024 | Jaggers et al. | |
| 2024/0114657 A1 | 4/2024 | Helberg et al. | |
| 2024/0114658 A1 | 4/2024 | Helberg et al. | |
| 2024/0114664 A1 | 4/2024 | Radke | |
| 2024/0332127 A1 | 10/2024 | Lee et al. | |

FOREIGN PATENT DOCUMENTS

| | | |
|---|---|---|
| EP | 1679744 A1 | 7/2006 |
| KR | 20190035151 A | 4/2019 |
| WO | 2011030976 A1 | 3/2011 |
| WO | 2024073225 A1 | 4/2024 |
| WO | 2024073227 A1 | 4/2024 |

OTHER PUBLICATIONS

International Search Report and Written Opinion, PCT/US2023/073762, Jan. 3, 2024, 13 pages.

Chi et al., Study on heat pipe assisted thermoelectric power generation system from exhaust gas, Heat Mass Transfer (2017) 53:3295-3304, DOI: 10.1007/s00231-017-2046-z, Published: Apr. 19, 2017, 10 pages.

* cited by examiner 900
902A
902B
902C
902D
904A
904B
904C

COMPONENT COOLER WITH MULTIPLE FLUID PATHS

BACKGROUND

Computing devices include various components, including processors and graphics processing units (GPUs) that generate heat. To dissipate the heat generated by such components, computing devices often include one or more cooling elements. Such cooling elements include, for example, fluid-cooled systems, heat pipes, vapor chambers, heat sinks, fans, and the like.

DETAILED DESCRIPTION

Figure 1:
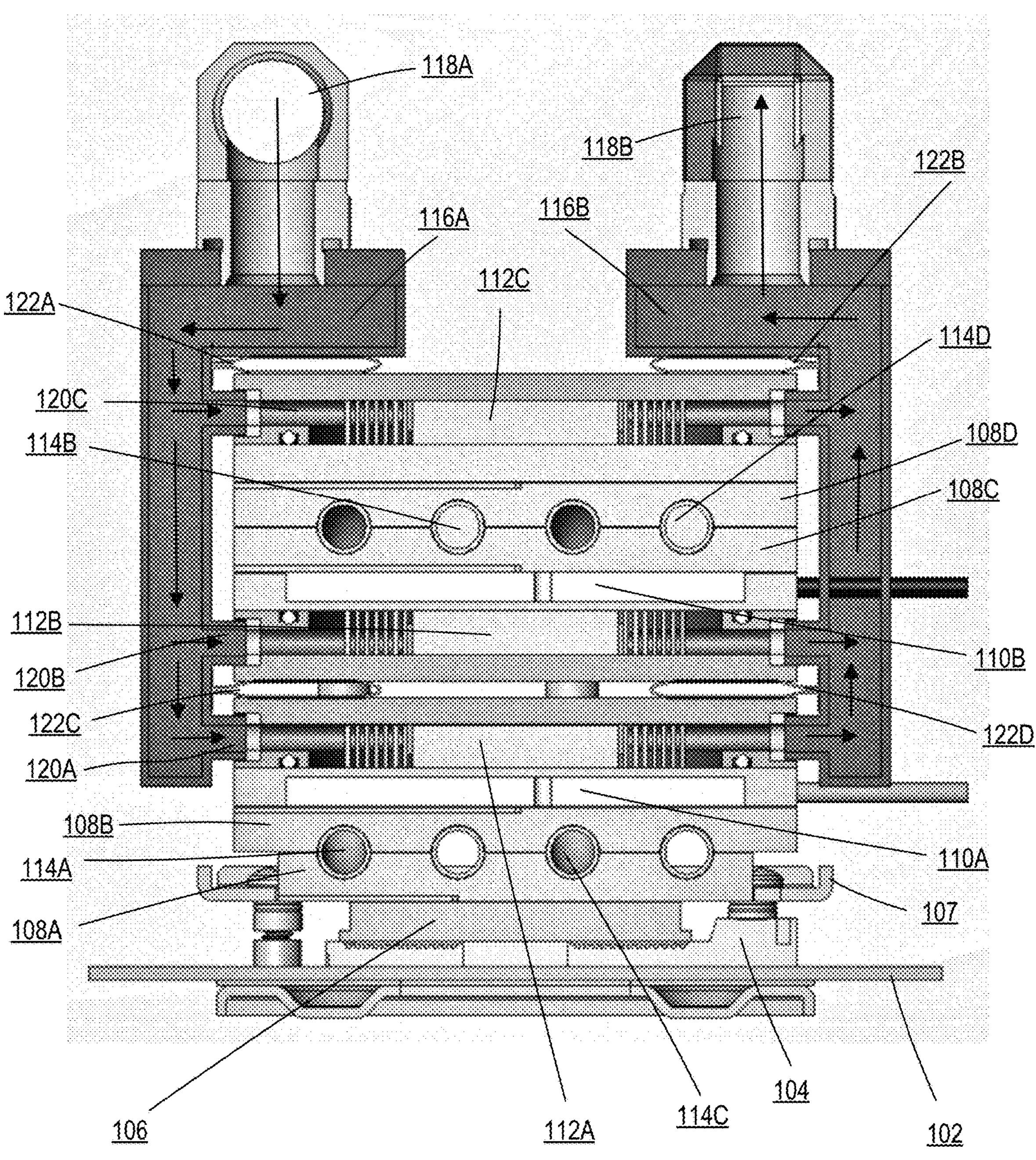
FIG. 1 is a diagram of a non-limiting example component cooling apparatus according to some implementations of the present disclosure.

Removing heat from an integrated circuit (IC), such as a central processing unit (CPU), accelerated processing unit (APU), a graphics processing unit (GPU), application specific IC (ASIC), field programmable gate array (FPGA), or the like, is becoming more difficult with an increased demand for greater processing power. A continuous push exists to increase power consumption and power density in ICs. For example, in processors, higher power consumption often correlates to higher performance. In addition, as processor technology advances, the number and density of transistors in a processor generally increase, resulting in faster and more power efficient processors. As transistor density increases, heat generation is more concentrated in an area and removal of heat from the processor becomes more difficult. Similar advances are occurring in other types of ICs which result in similar concentrated and increased heat generation.

Thermal cooling solutions are usually employed to assist in heat removal from components of a computing device such as ICs. Maintaining a cooler IC potentially equates to higher performance. More efficient thermal solutions (such as a cooler) for removing heat typically result in lower IC temperatures. Computing devices often include one or more cooling elements to dissipate heat generated by various ICs, such as processor cores. Such cooling elements include, for example, heat sinks, fluid cooling systems (e.g., water cooling systems), vapor chambers, heat pipes, fans, and the like to conduct heat generated by ICs of the computing device to fans that dissipate the heat out of the computing device. However, existing solutions may not adequately cool components of a computing system due to utilizing ambient temperature air to cool and/or lack of sufficient thermal contact between heat generating components and heat dissipating components.

This specification sets forth a component cooler for a computing device. In one or more implementations, the component cooler utilizes multiple heat pipes to split a heat load generated by a component, through multiple conduction paths between multiple heat transfer elements to facilitate heat removal from the component. The component cooler includes multiple fluid flow paths across multiple surfaces to facilitate heat removal from the component. The component cooler can also incorporate one or more thermoelectric coolers (TECs) in contact with one or more of the heat transfer elements to provide sub-ambient cooling to the heat transfer elements and facilitate heat removal from the component.

Existing fluid cooling solutions, however, typically utilize a single loop formed of a single flow path to carry cooling fluid through a fluid cooled system. The maximum efficiency of heat dissipation by such a fluid cooled system is limited to that provided by the type of fluid and the rate at which the fluid flows through the single path. Rather than being limited to a single flow path and its maximum heat dissipation efficiency, a fluid cooling system designed in accordance with the present disclosure includes multiple flow paths through multiple heat transfer elements. The maximum heat dissipation efficiency of such a multi-flow path fluid cooling system is far greater than one of a single flow path. In addition, the fluid flowing through each of the different paths may be controlled to flow at different rates. By controlling flow rates, differing amounts of heat dissipation can be targeted through the different paths. Such targeting of heat dissipation among different flow paths enables greater heat dissipation where it is most useful, increasing the overall efficiency of the system.

An apparatus for component cooling that includes a fluid cooling system with multiple fluid paths is described herein. The apparatus includes a first heat transfer element configured to be thermally coupled to a heat-generating component and a second heat transfer element configured to be thermally coupled to the heat-generating component. The apparatus also includes a manifold configured to receive a single fluid flow of a heat transfer medium and split the single fluid flow. The manifold splits the single fluid flow into a first split fluid flow and a second split fluid flow. The manifold provides that first split fluid to the first heat transfer element and the second split fluid flow to the second heat transfer element. Examples of heat transfer mediums include water, glycols, various oils, hydrofluoric ethers, and others.

The manifold is also configured to merge the first split fluid flow and the second split fluid flow into a merged fluid flow after the first split fluid flow exits the first heat transfer element and the second split fluid flow exits the second heat transfer element. The manifold provides the merged fluid flow to a heat dissipating device. The heat-generating component comprises an integrated circuit.

In some implementations, the manifold includes a valve configured to control a flow rate of at least one of the first split fluid flow and the second split fluid flow. The valve, in some implementations, is configured to dynamically adjust the flow rate during operation of the apparatus.

The manifold may also include a first fluid passage providing the first split fluid flow through the first heat transfer element and a second fluid passage providing the second split fluid flow through the second heat transfer element. An interior diameter of the first fluid passage in some examples is greater than an interior diameter of the second fluid passage, resulting in a flow rate of the first split fluid flow through the first fluid passage being lower than a flow rate of the second split fluid flow through the second fluid passage. In other implementations, the first fluid passage includes a first valve configured to control a flow rate of the first split fluid flow, and the second fluid passage includes a second valve configured to control a flow rate of the second split fluid flow. In some implementations, the first valve and the second valve are configured to be adjusted dynamically, during operation of the apparatus.

The apparatus, in some aspects, includes a third heat transfer element configured to be thermally coupled to the heat-generating component. The manifold is configured to split the single fluid flow into a third split fluid flow (in addition to the first and second) and provide the third split fluid flow to the third heat transfer element. Additionally, the manifold is also configured to merge the third split fluid flow into the merged fluid flow (along with the first and second split fluid flows) after the third split fluid flow exits third heat transfer element. The manifold may control the flow rates of one or more of the first, second, or third split fluid flows such that, a flow rate of the first split fluid flow is different than the flow rate of the second split fluid flow and different than the flow rate of the third split fluid flow.

The apparatus can also include a plurality of heat transfer structures thermally coupled between the first heat transfer element and the second heat transfer element. Each of the plurality of heat transfer structures is configured to provide a separate heat conduction path from the first heat transfer element to the second heat transfer element. The plurality of heat transfer structures can include at least one heat pipe. In some implementations, the first and second heat transfer element includes at least one of a first base plate and a first cold plate.

In some implementations, a first thermoelectric cooler is thermally coupled to the first heat transfer element. A second thermoelectric cooler may also be thermally coupled to the second heat transfer element.

Also described herein is a component cooling assembly that includes multiple fluid flow paths. The component cooling assembly includes an integrated circuit, a first heat transfer element thermally coupled to the integrated circuit, a second heat transfer element thermally coupled to the integrated circuit; and a manifold. The manifold is configured to receive a single fluid flow of a heat transfer medium and split the single fluid flow into a first split fluid flow provided to the first heat transfer element and a second split fluid flow provided to the second heat transfer element. The manifold is also configured to merge the first split fluid flow and the second split fluid flow into a merged fluid flow after the first split fluid flow exits the first heat transfer element and the second split fluid flow exits the second heat transfer element. In some examples, the manifold also includes at least one valve configured to control a flow rate of the first split fluid flow and the second split fluid flow.

Also described in this specification are various manifolds for a component cooling apparatus. Such a manifold includes a manifold inlet configured to receive a single fluid flow of a heat transfer medium. The manifold also includes a first fluid passage and a second fluid passage configured to split the single fluid flow into a first split fluid flow and a second split fluid flow. The first fluid passage is adapted to carry the first split fluid flow to an inlet of a first heat transfer element and the second fluid passage is adapted to carry the second split fluid flow to an inlet of a second heat transfer element. The manifold also includes a manifold outlet. The manifold outlet is configured to receive the first split fluid flow from an outlet of the first heat transfer element, receive the second split fluid flow from an outlet of the second heat transfer element, and merge the first and second split fluid flows into a merged fluid flow.

Various implementations of a component cooling apparatus are described with reference to drawings beginning with FIG. 1. FIG. 1 is a diagram of a non-limiting example component cooling apparatus 100 according to some implementations of the present disclosure. The example component cooling apparatus 100 of FIG. 1 is shown in a cross-sectional view. The example component cooling apparatus 100 can be implemented in a variety of computing devices including desktop computing devices, mobile computing devices, laptops, tablets, hybrid laptop/tablet computing devices, gaming devices, set top boxes, and the like.

The example component cooling apparatus 100 of FIG. 1 includes a substrate 102. The substrate 102 of FIG. 1 may be a printed circuit board (PCB) such as a motherboard of a computing device. The substrate 102 is coupled to an IC socket 104 which is further coupled to a bottom surface of a processor 106. A processor is used here as an example of a heat generating component, but readers of skill in the art will recognize that components that could benefit from the example cooling apparatus described in this specification can include any type of IC. In various examples, the processor 106 includes a CPU, an APU, a GPU, an FPGA, an ASIC, or a digital signal processor (DSP).

A top surface of the processor 106 is thermally coupled to a bottom surface of a first base plate 108A. A base plate is a component of a heat pipe assembly through which various heat pipes conduct heat. The first base plate 108A is connected to the substrate 102 via a mounting plate 107. A top surface of the first base plate 108A is coupled to a bottom surface of a second base plate 108B. The first base plate 108A and the second base plate 108B may be constructed of a conductive metal, such as copper. In some implementations, the first base plate 108A and the second base plate 108B are replaced with a single base plate.

A top surface of the second base plate 108B is thermally coupled to a bottom surface of a first thermoelectric cooler (TEC) 110A. A TEC is a semiconductor device having two sides which function to transfer heat from one side to the other when current is passed through the TEC. A top surface of the first TEC 110A is thermally coupled to a first cold plate 112A. A cold plate is a device that uses a fluid to transfer heat from a device to a remote heat exchanger. Although various implementations are described as using cold plates as heat transfer elements, in other implementations, other suitable heat transfer elements are used such as base plates or heatsinks.

The component cooling apparatus 100 also includes a second cold plate 112B having a top surface thermally coupled to a bottom surface of a second TEC 110B. A top surface of the second TEC 110B is thermally coupled to a bottom surface of a third base plate 108C. A top surface of third base plate 108C is coupled to a bottom surface of a fourth base plate 108D. The third base plate 108C and the fourth base plate 108D are constructed of a conductive metal such as copper. In an implementation, the third base plate 108C and the fourth base plate 108D are replaced with a single base plate.

The component cooling apparatus of FIG. 1 also includes a third cold plate 112C having a bottom surface thermally coupled to a top surface of the fourth base plate 108D. In an implementation, each of the first cold plate 112A, the second cold plate 112B, and the third cold plate 112C include a plurality of fins to facilitate transfer of heat to a heat transfer medium such as air of a fluid.

The component cooling apparatus 100 also includes multiple heat pipes 114A, 114B, 114C, and 114D. Each of the heat pipes 114A-114D has a first end disposed between and in thermal contact with the first base plate 108A and the second base plate 108B, and a second end disposed between and in thermal contact with the third base plate 108C and the fourth base plate 108D. Each of the heat pipes 114A, 114B, 114C, and 114D include a middle portion between the first end and the second end that is external to each of the base plates 108A, 108B, 108C, and 108D. In one or more implementations, each of the heat pipes 114A, 114B, 114C, and 114D are formed in a half-loop configuration as further illustrated in FIG. 2. In the implementation illustrated in FIG. 1, the heat pipes 114A-114D have a substantially circular cross section. In a particular implementation, the heat pipes 114A and 114C extend from a side of the component cooling apparatus 100, and the heat pipes 114B and 114D extend from an opposite side of the component cooling apparatus 100. Although various implementations are described as using heat pipes as heat transfer structures, other implementations may utilize other suitable heat transfer structures such as, for example, vapor chambers.

The component cooling apparatus 100 also includes a fluid manifold. The fluid manifold includes a manifold inlet portion 116A and a manifold outlet portion 116B disposed on opposing sides of the component cooling apparatus 100. The manifold inlet portion 116A includes a fluid inlet 118A, and the manifold outlet portion 116B includes a fluid outlet 118B. In an implementation, the fluid inlet 118A and the fluid outlet 118B are each positioned in opposite directions. In other implementations, the fluid inlet 118A and the fluid outlet 118B are each positioned in the same or any direction.

The fluid manifold includes a first fluid passage 120A extending from the manifold inlet portion 116A to the manifold outlet portion 116B. The first fluid passage 120A is in thermal contact with the first cold plate 112A. The fluid manifold includes a second fluid passage 120B extending from the manifold inlet portion 116A to the manifold outlet portion 116B and in thermal contact with the second cold plate 112B. The fluid manifold also includes a third fluid passage 120C extending from the manifold inlet portion 116A to the manifold outlet portion 116B and in thermal contact with the third cold plate 112C. During operation of the component cooling apparatus 100, a fluid loop that includes a fluid pump and a radiator (not shown) is coupled between the fluid inlet 118A and the fluid outlet 118B via tubing or the like. The fluid pump causes a flow of a cooling fluid within the fluid manifold into the manifold inlet portion 116A. The cooling fluid is split through each of the first fluid passage 120A, the second fluid passage 120B, and the third fluid passage 120C. The separate flows are merged within the manifold outlet portion 116B and output from the fluid outlet 118B to the radiator.

In an implementation, the flow of fluid through each of the first fluid passage 120A, the second fluid passage 120B, and the third fluid passage 120C is varied by constructing the sizes of one or more the first fluid passage 120A, second fluid passage 120B, and the third fluid passage 120C to be different from one another to achieve a desired flow rate through each of the fluid passages 120A, 120B, and 120C. In a particular example, the first fluid passage 120A is sized to have a greater flow rate than the second fluid passage 120B and the third fluid passage 120C due to an expectation of the amount of heat transferred to the first fluid passage 120A being greater than that of the second fluid passage 120B and the third fluid passage 120C. In an implementation, a diameter of the first fluid passage 120A is greater than that of the second fluid passage 120B or the third fluid passage 120C. In another implementation, one or more controllable valves are positioned within one or more of the first fluid passage 120A, the second fluid passage 120B, and the third fluid passage 120C to allow varying of the flow rates through the fluid passages. Although the implementation illustrated in FIG. 1 includes three fluid passages, other implementations have less than three or more than three fluid passages within the fluid manifold.

The component cooling apparatus 100 includes a first spring mechanism 122A and second spring mechanism 122B. The first spring mechanism 122A is disposed between the manifold inlet portion 116A and the third cold plate 112C. The first spring mechanism 122A is rigidly coupled to a sidewall of the manifold inlet portion 116A and exerts a first upward force to the manifold inlet portion 116A and a first downward force to the third cold plate 112C. The terms 'upward' and 'downward' are used here for ease of explanation only and are relative to the example depicted in FIG. 1. The second spring mechanism 122B is disposed between the manifold outlet portion 116B and the third cold plate 112C. The second spring mechanism 122B is rigidly coupled to a sidewall of the manifold outlet portion 116B and exerts a second upward force to the manifold outlet portion 116B and a second downward force to the third cold plate 112C. The force exerted by the first and second spring mechanisms to third cold plate 112C, cause the third cold plate maintain thermal contact with the fourth base plate 108D. In the implementation of FIG. 1, the first and second spring mechanisms are positioned on opposing ends of the third cold plate 112C and press the third cold plate towards the fourth cold plate 108D. Being on opposing ends, the force applied to the third cold plate by both springs is effectively balanced and causes the third cold plate to be pressed against (and thermally coupled to) the fourth cold plate in a relatively equal distribution across the surface area of the third and fourth cold plates.

The component cooling apparatus 100 of FIG. 1 also includes a third spring mechanism 122C and a fourth spring mechanism 122D disposed between the second cold plate 112B and the first cold plate 112A. The third spring mechanism 122C and the fourth spring mechanism 122D are configured to exert a force between the first cold plate 112A and the second cold plate 112B to maintain thermal contact between the first cold plate 112A and the first TEC 110A, and maintain thermal contact between the second cold plate 112B and the second TEC 110B.

Each of the first spring mechanism 122A, the second spring mechanism 122B, the third spring mechanism 122C, and the fourth spring mechanism 122D are coupled to a side portion of fluid manifold. In the implementation illustrated in FIG. 1, the first spring mechanism 122A and the third spring mechanism 122C are coupled to a side of the manifold inlet portion 116A, and the second spring mechanism 122B and the fourth spring mechanism 122D are coupled to a side of the manifold outlet portion 116B. In various implementations, the spring mechanisms 122A-122D include one or more of, for example, a leaf spring, a coil spring, a pneumatic (e.g., a gas and/or fluid) spring, or a flat spring.

The third spring mechanism 122C has a rigid coupling to the sidewall of the manifold inlet portion 116A and exerts an upward force to the second cold plate 112B and a downward force to the first cold plate 112A. Similarly, the fourth spring mechanism 122D has a rigid coupling to the sidewall of the manifold outlet portion 116B and exerts an upward force to the second cold plate 112B and a downward force to the first cold plate 112A. As a result, thermal contact is maintained between the first cold plate 112A and the first TEC 110A, and between the second cold plate 112B and the second TEC 110B.

Typical thermal solutions that utilize spring mechanisms to maintain thermal contact between surfaces do not rigidly attach the spring mechanism to a surface. As a result, maintaining positioning of the spring mechanisms during assembly of the component cooler is more difficult. In addition, the spring mechanisms are more likely to become displaced during use of the component cooler when not rigidly attached to a surface. In the component cooler of FIG. 1, the rigid coupling of the first spring mechanism 122A, the second spring mechanism 122B, the third spring mechanism 122C, and the fourth spring mechanism 122D to the fluid manifold facilitates easier assembly of the component cooler apparatus 100. In an example implementation, the first spring mechanism 122A, the second spring mechanism 122B, the third spring mechanism 122C, and the fourth spring mechanism 122D are rigidly attached to the fluid manifold prior to installation of the cold plates 112A-112C so that the position of the spring mechanisms are maintained during assembly. In addition, the rigid coupling of the spring mechanisms to the fluid manifold assists in maintaining the positions of the spring mechanism during use of the component cooler apparatus 100.

In this example, the spring mechanisms all have substantially the same widths and spring constant so that the distance between the two objects upon which the spring mechanism exerts a force is substantially the same. A spring constant defines a ratio of the force affecting a spring to the displacement caused by the spring. When two springs have the same spring constant and width, the two springs will exert substantially the same force on two objects of similar mass, creating the same distance between the two objects. For example, the first spring mechanism 122A has a width and spring constant that is substantially similar to that of the third spring mechanism 122C. As such, the distance between the manifold inlet portion 116A and the third cold plate 112C (maintained by the first spring mechanism's force), is substantially equivalent to the distance between the second cold plate 112B and the first cold plate 112A (maintained by the second spring mechanism's force). The widths and spring constant of the spring mechanisms may be selected so that, when the spring mechanisms are compressed, the distances between cold plates, and between manifold portions and cold plates, may provide various sized gaps according to desired thermal characteristics. Larger gaps, for example, provide additional airflow across surfaces (such as the cold plate surfaces) which, in some cases, results in additional cooling through greater heat dissipation relative to a smaller gap. In other cases, a smaller gap between two components (such as two cold plates) may result in additional cooling efficiency of the components.

The example component cooling apparatus 100 of FIG. 1 provides for multiple heat conduction paths between heat transfer elements for removal of heat generated by the processor 106 as further described below. During operation of the processor 106, an amount of heat generated by the processor is transferred to the first base plate 108A thermally coupled to the processor 106, and a portion of the heat transferred to the first base plate 108A is further transferred to the second base plate 108B. Each of the heat pipes 114A, 114B, 114C, and 114D is configured to transfer a portion of the heat received from the first base plate 108A and the second base plate 108B to the third base plate 108C and the fourth base plate 108D. In a particular implementation, the heat pipes 114A, 114B, 114C, and 114D employ a phase transition between a heat transfer fluid within the heat pipes 114A, 114B, 114C, and 114D to transfer heat from the first base plate 108A and the second base plate 108B to the third base plate 108C and the fourth base plate 108D.

The first TEC 110A is controlled to remove an amount of heat from the second base plate 108B and transfer the heat to the first cold plate 112A. In an implementation, the amount of heat transferred by the first TEC 110A is controlled by adjusting a current provided to the first TEC 110A. The first TEC 110A provides sub-ambient temperature cooling to the second base plate 108B. The second TEC 110B is controlled to remove an amount of heat from the third base plate 108C and transfer the heat to the second cold plate 112B. The amount of heat transferred by the second TEC 110B is controlled by adjusting a current provided to the second TEC 110B. The second TEC 110B provides sub-ambient temperature cooling to the third base plate 108C. In one or more implementations, the amount of power provided to one or more of the first TEC 110A or the second TEC 110B is adapted based on monitored system parameters, such as processor activity, to control the amount of cooling provided by the respective TEC.

A fluid pump (not shown) causes a flow of a cooling fluid to enter the manifold inlet portion 116A through the fluid inlet 118A. The fluid is split to flow through each of the first fluid passage 120A, the second fluid passage 120B, and the third fluid passage 120C. The first fluid passage 120A is in thermal contact with the first cold plate 112A, the second fluid passage 120B is in thermal contact with the second cold plate 112B, and the third fluid passage 120C is in thermal contact with the third cold plate 112C. As fluid flows through the first fluid passage 120A, a portion of heat is transferred to the fluid from the first cold plate 112A. Similarly, as fluid flows through the second fluid passage 120B, a portion of heat is transferred to the fluid from the second cold plate 112B. As fluid flows through the third fluid passage 120C a portion of heat is transferred to the fluid from the third cold plate 112C. The separate flows from each of the first fluid passage 120A, the second fluid passage 120B, and the third fluid passage 120C are merged within the manifold outlet portion 116B and output from the fluid outlet 118B to one or more radiators (not shown).

Figure 2:
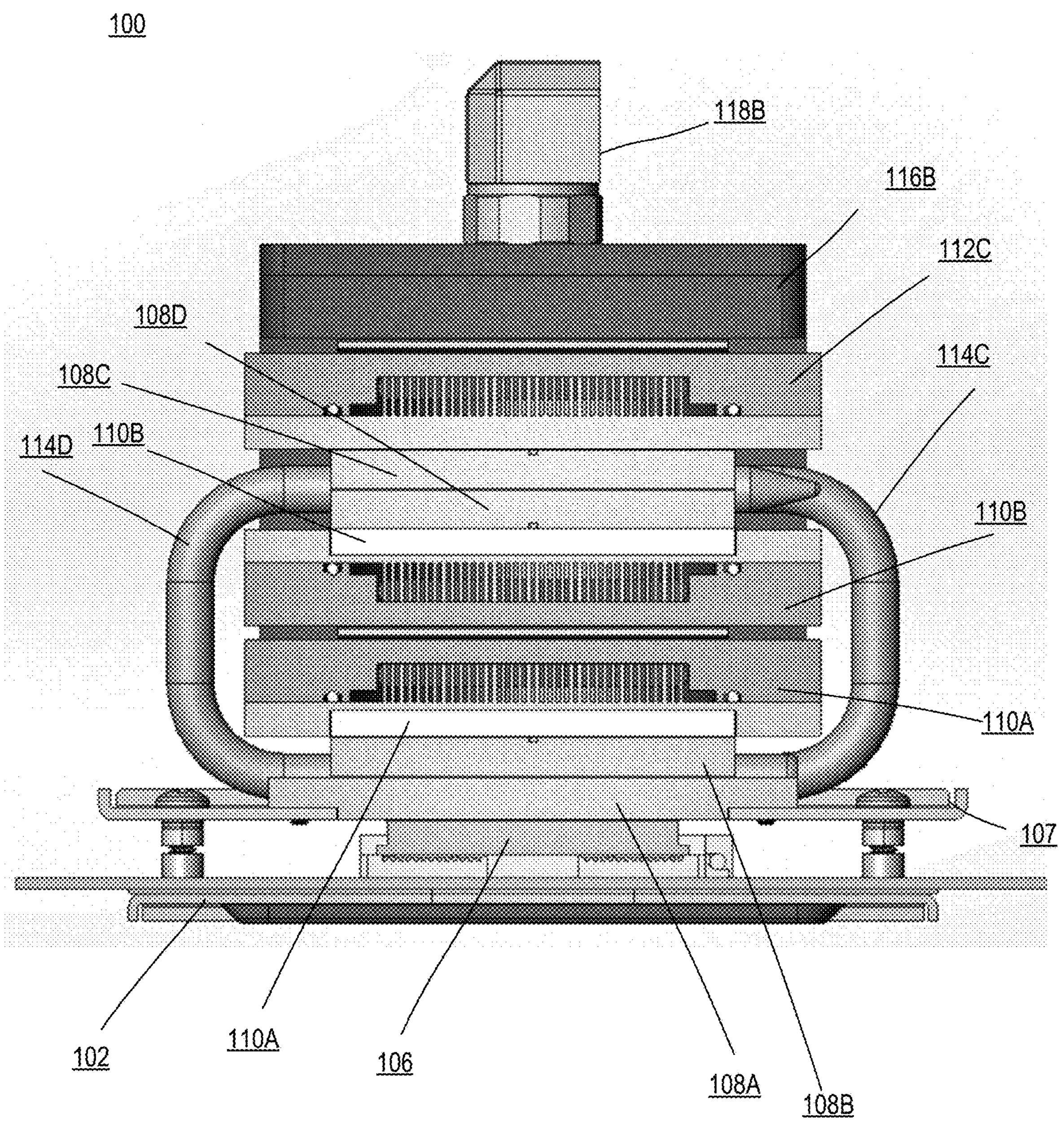
FIG. 2 is a side view of the component cooling apparatus of FIG. 1 according to implementations of the present disclosure.

For further explanation, FIG. 2 shows a side view of the component cooling apparatus 100 of FIG. 1 according to implementations of the present disclosure. FIG. 2 shows the heat pipes 114A, 114B, 114C, and 114D formed in a loop configuration. A first end of each of the heat pipes 114A, 114B, 114C, and 114D are in thermal contact with the first base plate 108A and the second base plate 108B. A second end of each of the heat pipes 114B, 114C, and 114D are in thermal contact with the third base plate 108C and the fourth base plate 108D.

Figure 3:
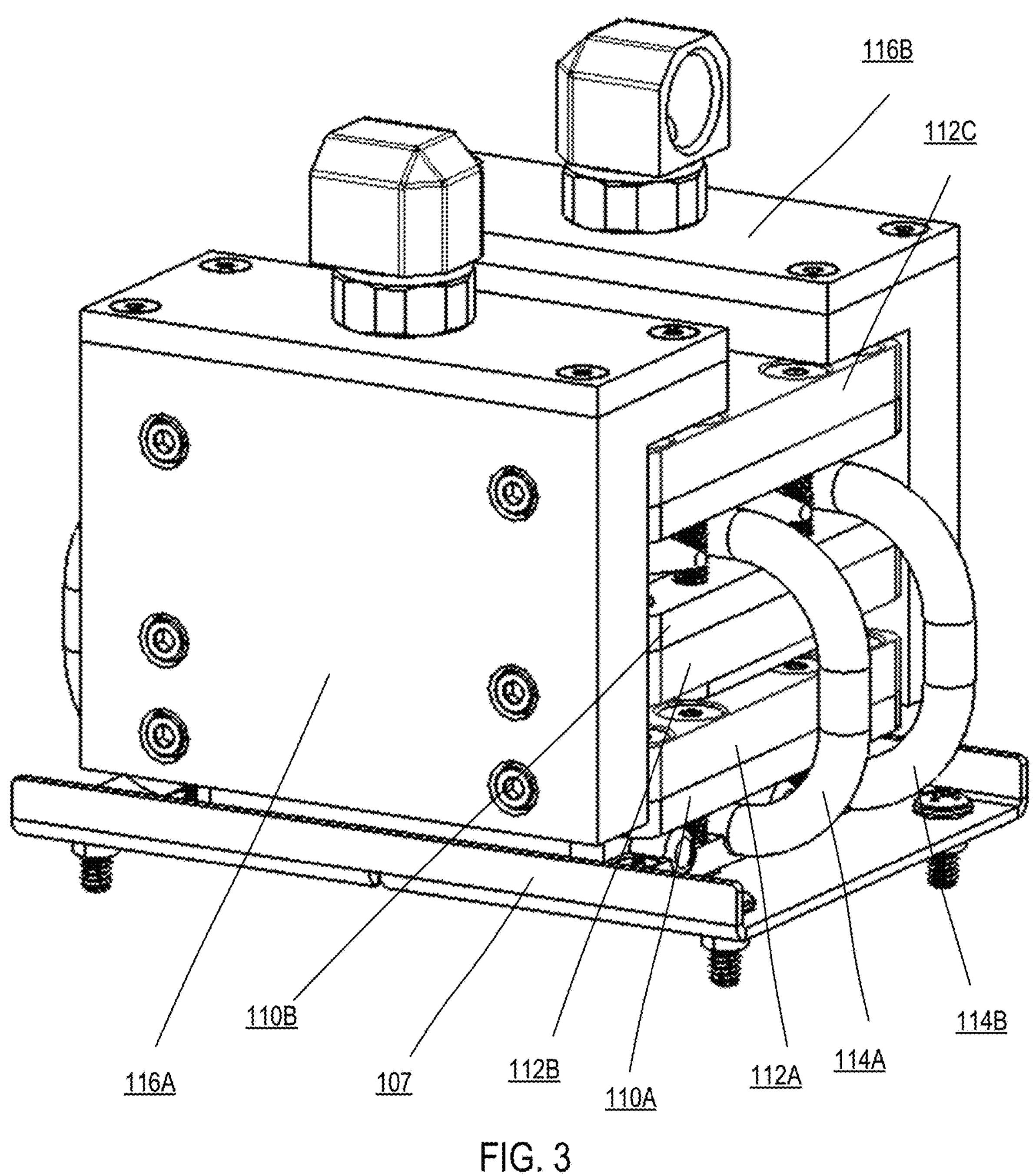
FIG. 3 is a perspective view of a portion of the component cooling apparatus of FIG. 1 according to implementations of the present disclosure.

For further explanation, FIG. 3 shows a perspective view of a portion of the component cooling apparatus 100 of FIG. 1 according to implementations of the present disclosure. FIG. 3 shows the component cooling apparatus uncoupled from the processor 106 and the substrate 102.

Figure 4:
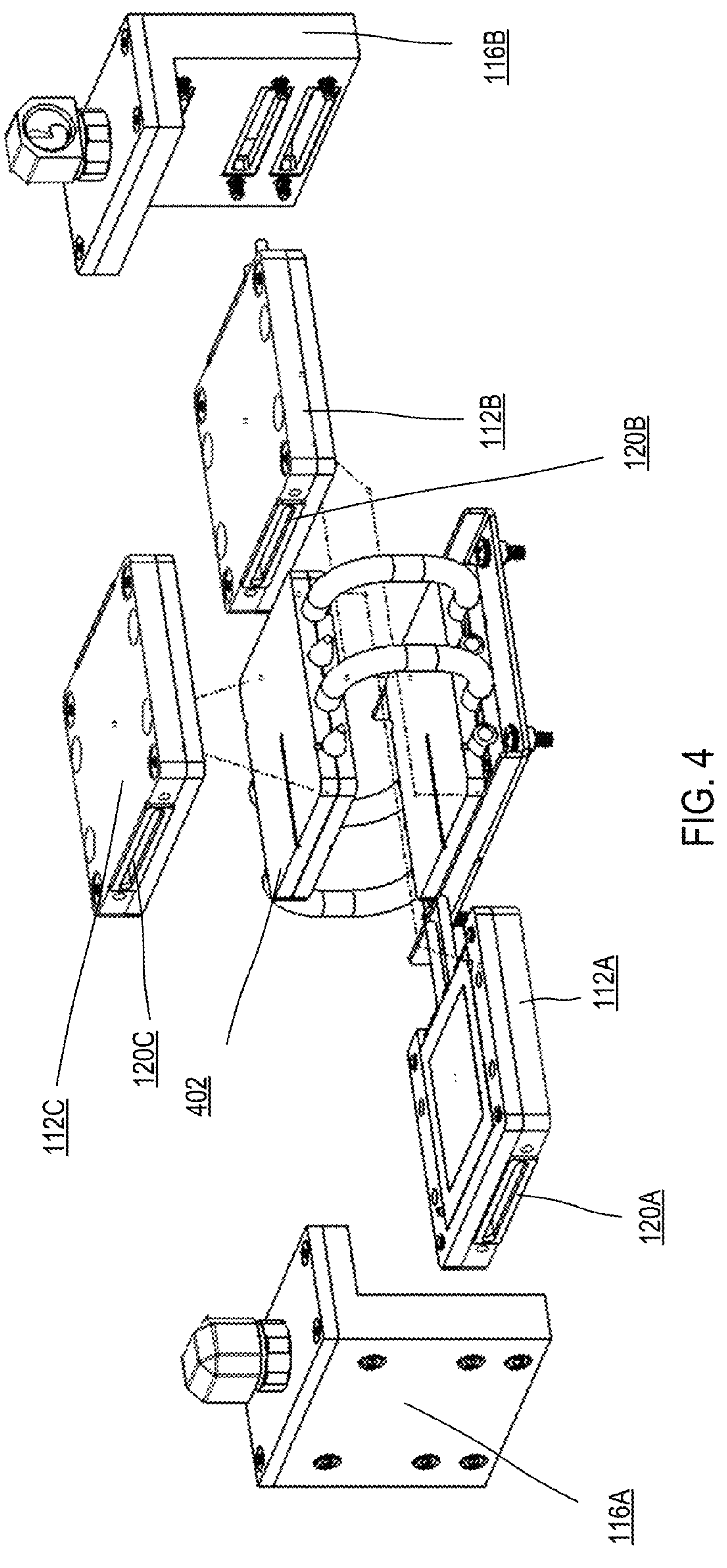
FIG. 4 is an exploded view of the portion of the component cooling apparatus of FIG. 3 according to implementations of the present disclosure.

For further explanation, FIG. 4 shows an exploded view of the portion of the component cooling apparatus of FIG. 3 according to implementations of the present disclosure. FIG. 4 shows the manifold inlet portion 116A and the manifold outlet portion 116B disconnected from the first cold plate 112A, the second cold plate 112B, and the third cold plate 112C. FIG. 4 further shows the first cold plate 112A, the second cold plate 112B, and the third cold plate 112C disconnected from the heat pipe assembly 402. The heat pipe assembly includes the heat pipes 114A-114D and base plates 108A-108D illustrated in FIG. 1. FIG. 4 further shows the first fluid passage 120A through the first cold plate 112A, the second fluid passage 120B through the second cold plate 112B, and the third fluid passage 120C through the third cold plate 112C.

Figure 5:
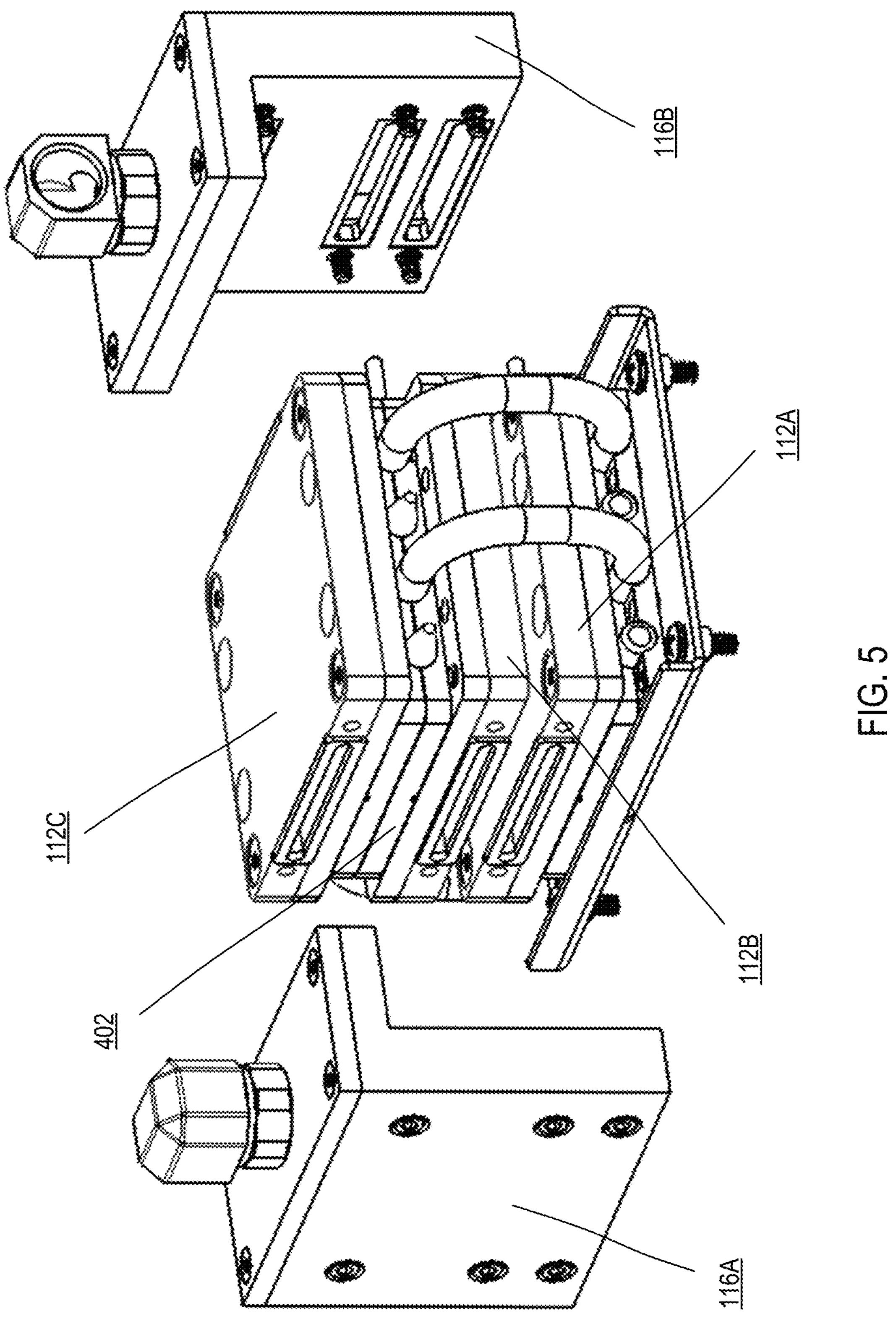
FIG. 5 is another exploded view of the portion of the component cooling apparatus of FIG. 3 according to implementations of the present disclosure.

For further explanation, FIG. 5 shows another exploded view of the portion of the component cooling apparatus of FIG. 3 according to implementations of the present disclosure. FIG. 5 shows the manifold inlet portion 116A and the manifold outlet portion 116B disconnected from the first cold plate 112A, the second cold plate 112B, and the third cold plate 112C. FIG. 5 further shows the first cold plate 112A, the second cold plate 112B, and the third cold plate 112C coupled to the heat pipe assembly 402.

Figure 6:
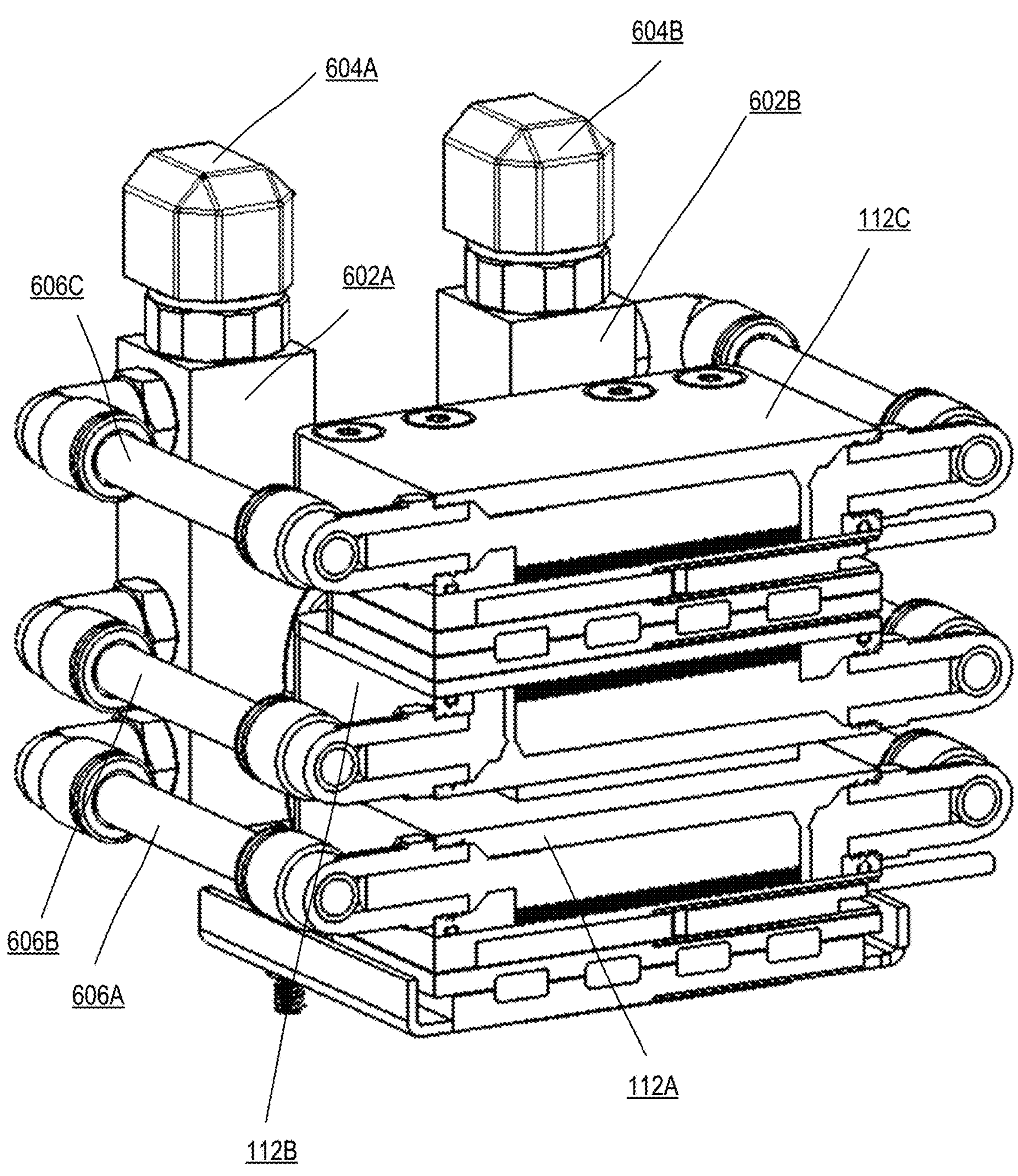
FIG. 6 is an implementation of a fluid manifold according to implementations of the present disclosure.

For further explanation, FIG. 6 shows another implementation of a fluid manifold 600 according to implementations of the present disclosure. FIG. 6 shows a cross-section view of the fluid manifold 600 as including a manifold inlet portion 602A and a manifold outlet portion 602B. The manifold inlet portion 602A includes a fluid inlet 604A, and the manifold outlet portion 602B includes a fluid outlet 604B. In an implementation, the fluid inlet 604A and the fluid outlet 604B are each positioned in the same direction. In other implementations, the fluid inlet 604A and the fluid outlet 604B are each positioned in any desired direction. The fluid manifold includes a first fluid passage 606A connecting the manifold inlet portion 602A to the manifold outlet portion 116B and in thermal contact with the first cold plate 112A. The fluid manifold includes a second fluid passage 606B connecting the manifold inlet portion 602A to the manifold outlet portion 602B and in thermal contact with the second cold plate 112B. The fluid manifold further includes a third fluid passage 606C connecting the manifold inlet portion 602A to the manifold outlet portion 602B and in thermal contact with the third cold plate 112C. In the implementation shown in FIG. 6, the manifold inlet portion 602A and the manifold outlet portion 602B are positioned behind and not in direct contact with the first cold plate 112A, the second cold plate 112B, and the third cold plate 112C.

Figure 7:
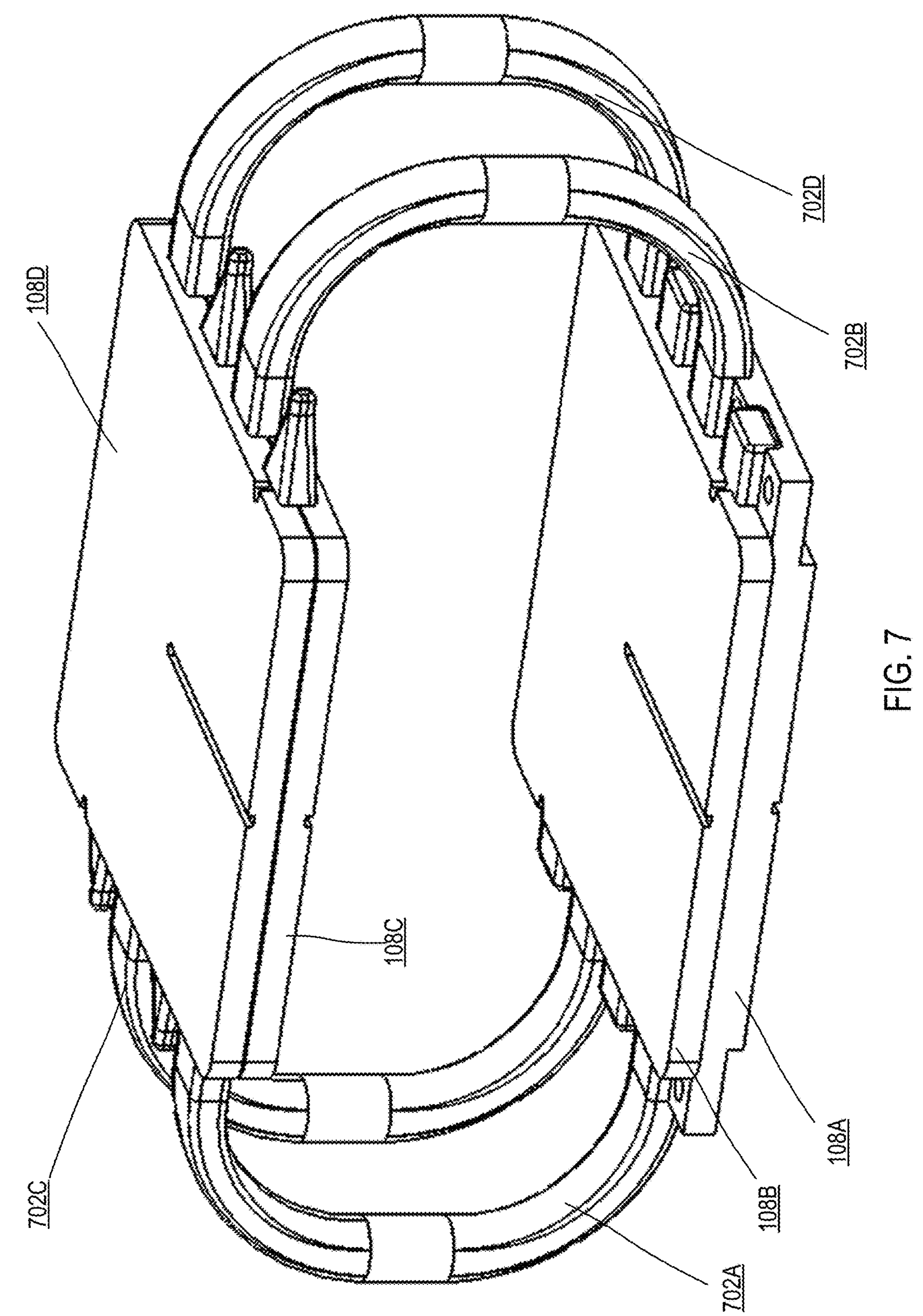
FIG. 7 is an implementation of a heat pipe assembly according to implementations of the present disclosure.

For further explanation, FIG. 7 shows another implementation of a heat pipe assembly 700 according to implementations of the present disclosure. The heat pipe assembly 700 includes a first heat pipe 702A, a second heat pipe 702B, a third heat pipe 702C, a fourth heat pipe 702D, the first base plate 108A, the second base plate 108B, the third base plate 108C, and the fourth base plate 108D. In the implementation illustrated in FIG. 7, the heat pipes 702A-702D have a substantially rectangular cross section. Each of the heat pipes 702A-702D include a first end in thermal contact with the first base plate 108A and the second base plate 108B, and a second end in thermal contact with the third base plate 108C and the fourth base plate 108D. Although various implementations show heat pipes having substantially circular and substantially rectangular cross sections, other implementations include heat pipes having any suitable cross-section.

Figure 8:
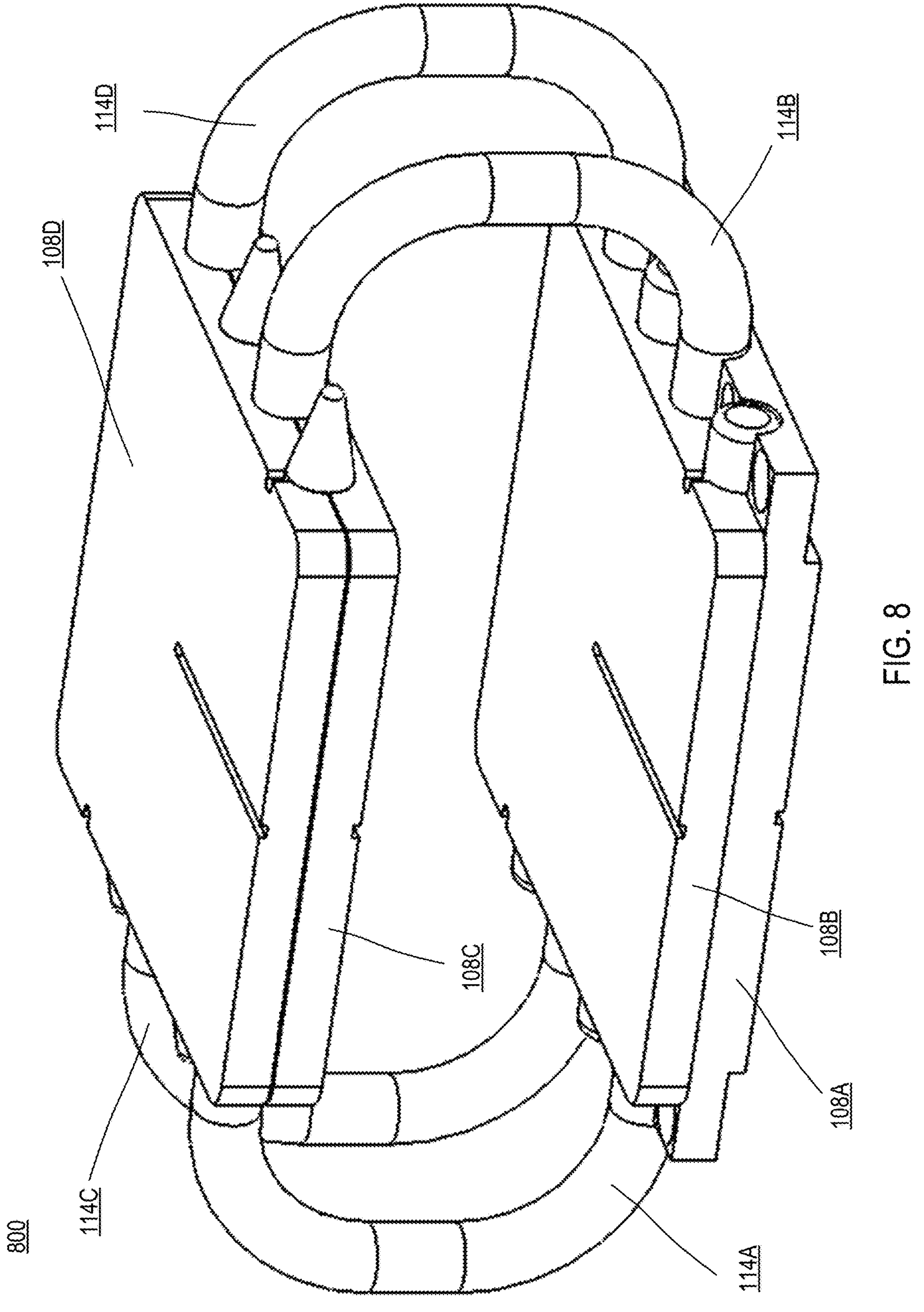
FIG. 8 is another implementation of a heat pipe assembly according to implementations of the present disclosure.

For further explanation, FIG. 8 shows another implementation of a heat pipe assembly 800 according to implementations of the present disclosure. The heat pipe assembly 800 includes the first heat pipe 114A, the second heat pipe 114B, the third heat pipe 114C, the fourth heat pipe 114D, the first base plate 108A, the second base plate 108B, the third base plate 108C, and the fourth base plate 108D. In the implementation illustrated in FIG. 8, the heat pipes 114A-114D have a substantially circular cross section. Each of the heat pipes 114A-114D include a first end in thermal contact with the first base plate 108A and the second base plate 108B, and a second end in thermal contact with the third base plate 108C and the fourth base plate 108D.

Figure 9:
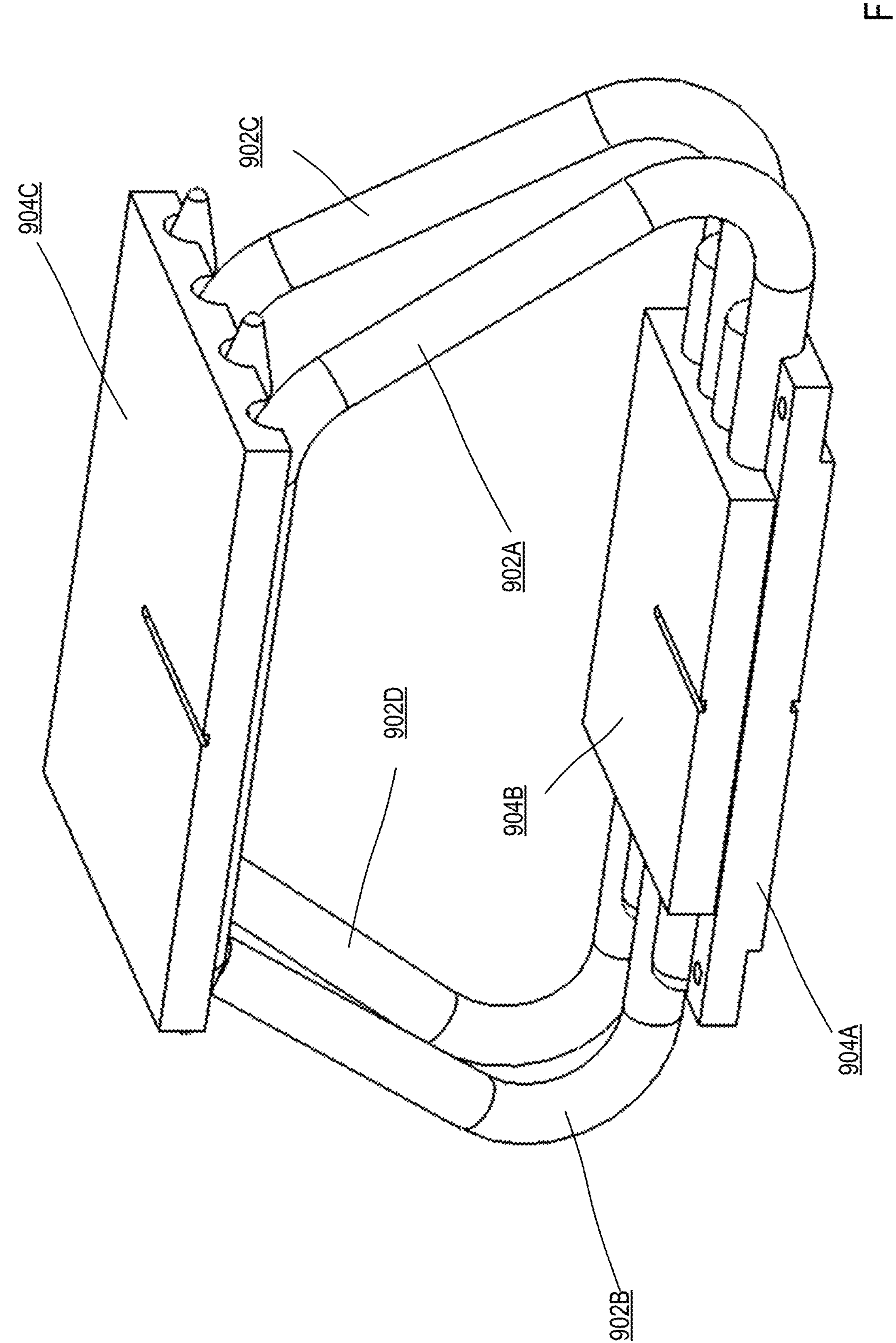
FIG. 9 is another implementation of a heat pipe assembly according to implementations of the present disclosure.

For further explanation, FIG. 9 shows another implementation of a heat pipe assembly 900 according to implementations of the present disclosure. The heat pipe assembly 900 includes a first heat pipe 902A, a second heat pipe 902B, a third heat pipe 902C, a fourth heat pipe 902D, a first base plate 904A, a second base plate 904B, and a third base plate 904C. In the implementation illustrated in FIG. 8, the heat pipes 902A-902D have a substantially circular cross section. In an implementation, the third base plate 904C has a larger surface area than those of the first base plate 904A and the second base plate 904B. Each of the heat pipes 902A-902D include a first end in thermal contact with the first base plate 904A and the second base plate 904B, and a second end in thermal contact with the third base plate 904C.

Figure 10:
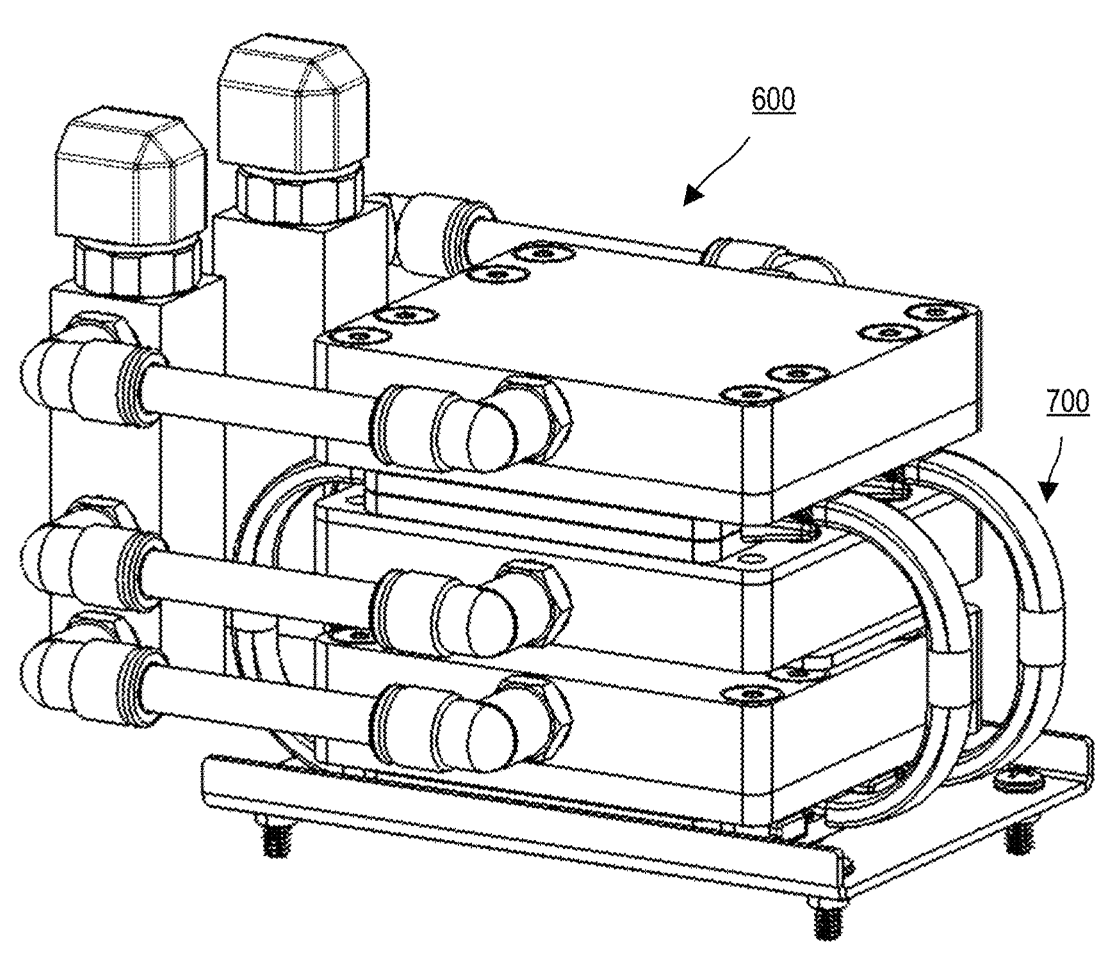
FIG. 10 is another example component cooling apparatus according to some implementations of the present disclosure.

For further explanation, FIG. 10 shows another example component cooling apparatus 1000 according to some implementations of the present disclosure. As shown in FIG. 10, the component cooling apparatus 1000 includes the fluid manifold 600 illustrated in FIG. 6 coupled with the heat pipe assembly 700 of FIG. 7.

Figure 11:
FIG. 11 is another example component cooling apparatus according to some implementations of the present disclosure.

For further explanation, FIG. 11 shows another example component cooling apparatus 1100 according to some implementations of the present disclosure. The example component cooling apparatus 1100 of FIG. 11 includes a substrate 1102 coupled to an IC socket 1104 which is further coupled to a processor 1106. The substrate 1102 includes, for example, a PCB such as a motherboard of a computing device. In various examples, the processor 1106 includes one or more of a CPU, an APU, a GPU, an FPGA, an ASIC, or a DSP. A top surface the processor 1106 is thermally coupled to a bottom surface of a first base plate 1108A. In an implementation, the first base plate 1108A is connected to the substrate 1102 via one or more standoffs. A top surface of the first base plate 1108A is coupled to a bottom surface of a second base plate 1108B. In one or more implementations, the first base plate 1108A and the second base plate 1108B are constructed of a conductive metal such as copper. In an implementation, the first base plate 1108A and the second base plate 1108B are replaced with a single base plate.

A top surface of the second base plate 1108B is thermally coupled to a bottom surface of a fluid block 1110. The fluid block 1110 includes a fluid inlet 1112A and a fluid outlet 1112B. The fluid block 1110 includes a fluid passage extending from the fluid inlet 1112A to the fluid outlet 1112B and in thermal contact with the second base plate 1108B. During operation of the component cooling apparatus 1100, a fluid loop including a fluid pump and a radiator (not shown) is coupled between the fluid inlet 1112A and the fluid outlet 1112B via tubing or the like. The fluid pump causes a flow of a heat transfer medium, such as water, within the fluid block 1110 from the fluid inlet 1112A to the fluid outlet 1112B to facilitate removal of heat from the second base plate 1108B to the radiator.

The component cooling apparatus 1100 further includes a heat sink fin stack 1114 having a top surface coupled to a bottom surface of a cooling fan assembly 1116 configured to direct an air flow to the heat sink fin stack 1114. In an implementation, the heat sink fin stack 1114 includes a plurality of fins to facilitate removal of heat from the heat sink fin stack 1114 via the air flow. The heat sink fin stack 1114 is supported from the substrate 1102 via a support frame 1118. In an implementation, the heat sink fin stack 1114 is substantially larger than either of the first base plate 1108A or the second base plate 1108B.

The component cooling apparatus 1100 further includes multiple heat pipes 1120A, 1120B, 1120C, and 1120D. Each of the heat pipes 1120A, 1120B, 1120C, and 1120D has a first end disposed between and in thermal contact with the first base plate 1108A and the second base plate 1108B, and a second end in thermal contact with the heat sink fin stack 1114. Each of the heat pipes 1120A, 1120B, 1120C, and 1120D include a middle portion between the first end and the second end that is external to each of the base plates 1108A, 1108B and the heat sink fin stack 1114.

In one or more implementations, each of the heat pipes 1120A, 1120B, 1120C, and 1120D are formed in a half-loop configuration. In the implementation illustrated in FIG. 11, the heat pipes 1120A-1120D have a substantially circular cross section. In a particular implementation, the heat pipes 1120A and 1120B extend from a side of the component cooling apparatus 1100, and the heat pipes 1120C and 1120D extend from an opposite side of the component cooling apparatus 1100. Although various implementations are described as using heat pipes as heat transfer structures, other implementations utilize other suitable heat transfer structures such as vapor chambers.

The example component cooling apparatus 1100 of FIG. 11 provides for multiple heat conduction paths between heat transfer elements for removal of heat generated by the processor 1106 as further described below. During operation of the processor 1106, an amount of heat generated by the processor 1106 is transferred to the first base plate 1108A thermally coupled to the processor 1106, and a portion of the heat transferred to the first base plate 1108A is transferred to the second base plate 1108B. Each of the heat pipes 1120A, 1120B, 1120C, and 1120D is configured to transfer a portion of the heat received from the first base plate 1108A and the second base plate 1108B to the heat sink fin stack 1114. The heat pipes 1120A, 1120B, 1120C, and 1120D employ a phase transition between a heat transfer fluid within the heat pipes 1120A, 1120B, 1120C, and 1120D to transfer heat from the first base plate 1108A and the second base plate 1108B to the heat sink fin stack 1114.

In another implementation the component cooling apparatus 1100 further includes a TEC positioned between and in thermal contact with the second base plate 1108B and the fluid block 1110. In another implementation, the component cooling apparatus 1100 further includes a TEC positioned between and in thermal contact with the heat sink fin stack 1114 and the cooling fan assembly 1116.

Figure 12:
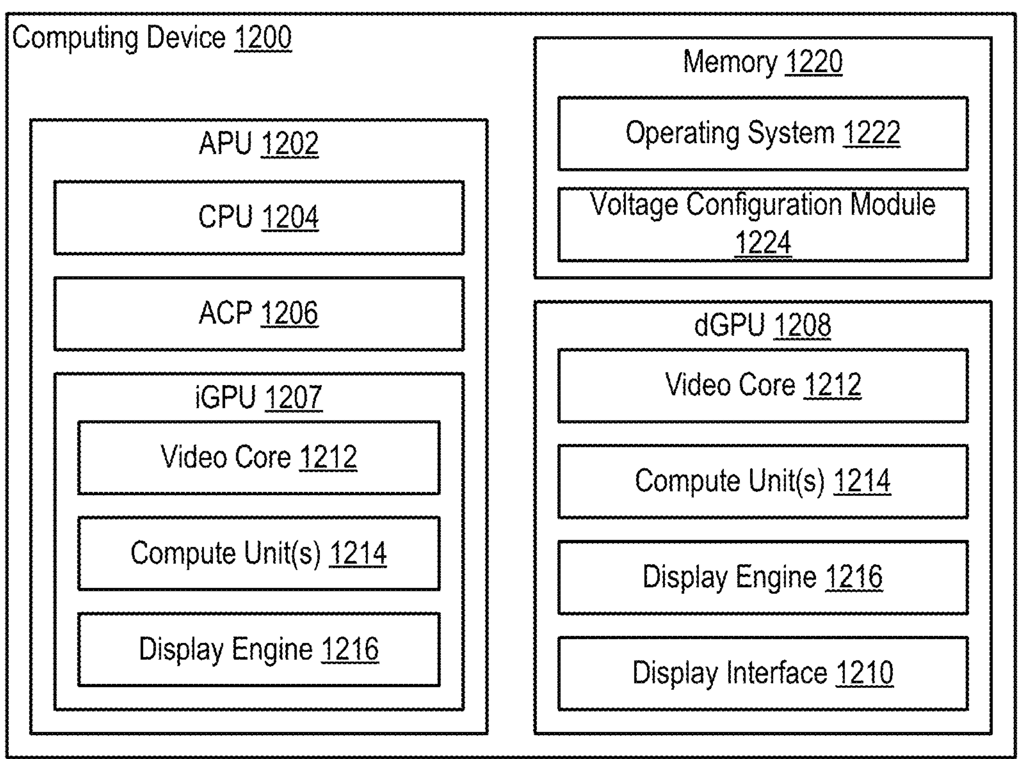
FIG. 12 is a block diagram of an example computing device for a component cooling apparatus according to some implementations.

FIG. 12 is a block diagram of an example computing device 1200 for a component cooling apparatus according to some implementations. The computing device 1200 includes an APU 1202. The APU 1202 is a microprocessor that includes a CPU 1204 and integrated graphics processing unit (iGPU) 1207 on a single die. The computing device 1200 also includes a discrete graphics processing unit (dGPU) 1208. Although the approaches set forth herein are described in the context of a computing device 1200 including a dGPU 1208 and an APU 1202 with an iGPU 1207, it is understood that the approaches set forth herein are applicable to any system or device incorporating both integrated and discrete GPUs. The dGPU 1208 is a peripheral or additional component of the computing device 1200 operatively coupled to the APU 1202. For example, in some implementations the dGPU 1208 is operatively coupled to the APU 1202 by a peripheral component interface express (PCIe) bus. Accordingly, in such an implementation, the dGPU 1208 is installed in a PCIe port on a motherboard or other PCB into which the APU 1202 is installed. By virtue of the operable connection between the APU 1202 and the dGPU 1208, the APU 1202 is capable of issuing instructions, rendering jobs, and the like, to the dGPU 1208. In some implementations, the dGPU 1208 includes a display interface 1210. The display interface 1210 is a port or socket to which an external monitor or display is connected. The display interface 1210 provides a video signal to the external display for presentation. The display interface 1210 includes, for example, a High Definition Multimedia Interface (HDMI) port, a Video Graphics Array (VGA) port, a Digital Visual Interface (DVI) port, a Universal Serial Bus C (USB-C) port, or other display port as can be appreciated.

The iGPU 1207 and dGPU 1208 each include one or more video cores 1212. A video core 1212 is a discrete processing unit, core, or other unit of hardware resources dedicated to encoding and decoding video data. For example, each video core 1212 facilitates video encoding or decoding operations such as decoding streaming video content, encoding video for video conferencing applications, encoding video files for later playback, and the like. In some implementations, the video core 1212 implements particular hardware architectures or configurations for video encoding and decoding, such as Video Core Next (VCN).

The iGPU 1207 and dGPU 1208 also each include one or more compute units 1214. Each compute unit 1214 includes one or more cores that share a local cache, allowing for parallel processing and cache access for each core within a given compute unit 1214. The compute units 1214 facilitate various calculations and processing jobs submitted to the iGPU 1207 and dGPU 1208, including rendering operations, machine learning operations, and the like.

The iGPU 1207 and dGPU 1208 also each include a display engine 1216. Each display engine 1216 manages the presentation of video or image content to a display of the computing device 1200 (e.g., an internal mobile device display or an external display coupled to a display interface 1210). In some implementations, the display engines 1216 implement display core technology such as Display Core Next (DCN) and the like. The APU 1202 also includes an audio co-processor (ACP) 1206. The ACP 1206 is a core, processor, or other allocation of hardware components dedicated to audio encoding and decoding.

The computing device 1200 also includes memory 1220 such as Random Access Memory (RAM). Stored in memory 1220 is an operating system 1222 and a voltage configuration module 1224. The operating system 1222 and voltage configuration module 1224 in the example of FIG. 12 are shown in memory 1220, but many components of such software typically are stored in non-volatile memory also, such as, for example, on a disk drive or other storage medium. Operating systems 1222 useful in the computing device 1200 according to certain implementations include UNIX™, Linux, Microsoft Window™, and others as will occur to those of skill in the art.

The voltage configuration module 1224 is a module for controlling the voltage allocated to the APU 1202 and dGPU 1208. For example, the voltage configuration module 1224 implements SmartShift technology to allocate voltage in order to increase performance for particular applications. Depending on the particular workload executed in the computing device 1200, the voltage configuration module 1224 increases or decreases the voltage used by the APU 1202 and dGPU 1208. As an example, for a workload that relies on the dGPU 1208 heavily, such as complex graphics rendering, the voltage configuration module 1224 will increase the voltage to the dGPU 1208. As another example, for a workload that relies on the APU 1202 more than the dGPU 1208 such as audio encoding, or when the computing device 1200 is in a low power consumption state, the voltage configuration module 1224 will increase the voltage to the APU 1202. In some implementations, an increase to the voltage of one component (e.g., to the APU 1202 and dGPU 1208) will cause or be performed in response to a decrease in the voltage of the other component.

In some implementations, a modification to the voltage of a given component will cause or be performed in response to a modification in operating frequency of the given component. For example, assume that a command or request is issued to increase the operating frequency of the dGPU 1208 in response to a rendering job being submitted to the dGPU 1208. The voltage configuration module 1224 will then increase the voltage provided to the dGPU 1208 so that the dGPU 1208 is able to operate at the increased frequency. In some implementations, the frequency of a given component is defined according to a frequency voltage curve. A frequency voltage curve defines a relationship between the frequency of a component and its corresponding voltage. In other words, the frequency voltage curve defines, for a given frequency, a corresponding voltage for the component.

One skilled in the art will appreciate that the voltage configuration module 1224 operates within various constraints for voltages in the computing device 1200. For example, in some implementations, the APU 1202 and dGPU 1208 have defined minimum and maximum safe voltages. One skilled in the art will appreciate that the particular voltage limits for the APU 1202 and dGPU 1208 are dependent on particular cooling and thermal solutions implemented in the computing device 1200.

One skilled in the art will also appreciate that the approaches described herein for a component cooler provide for increased cooling capabilities for the APU 1202 and dGPU 1208, allowing for increased maximum safe operational voltages for both the APU 1202 and dGPU 1208. Thus, a computational performance increase is achieved though the improved cooling approaches described herein.

Figure 13:
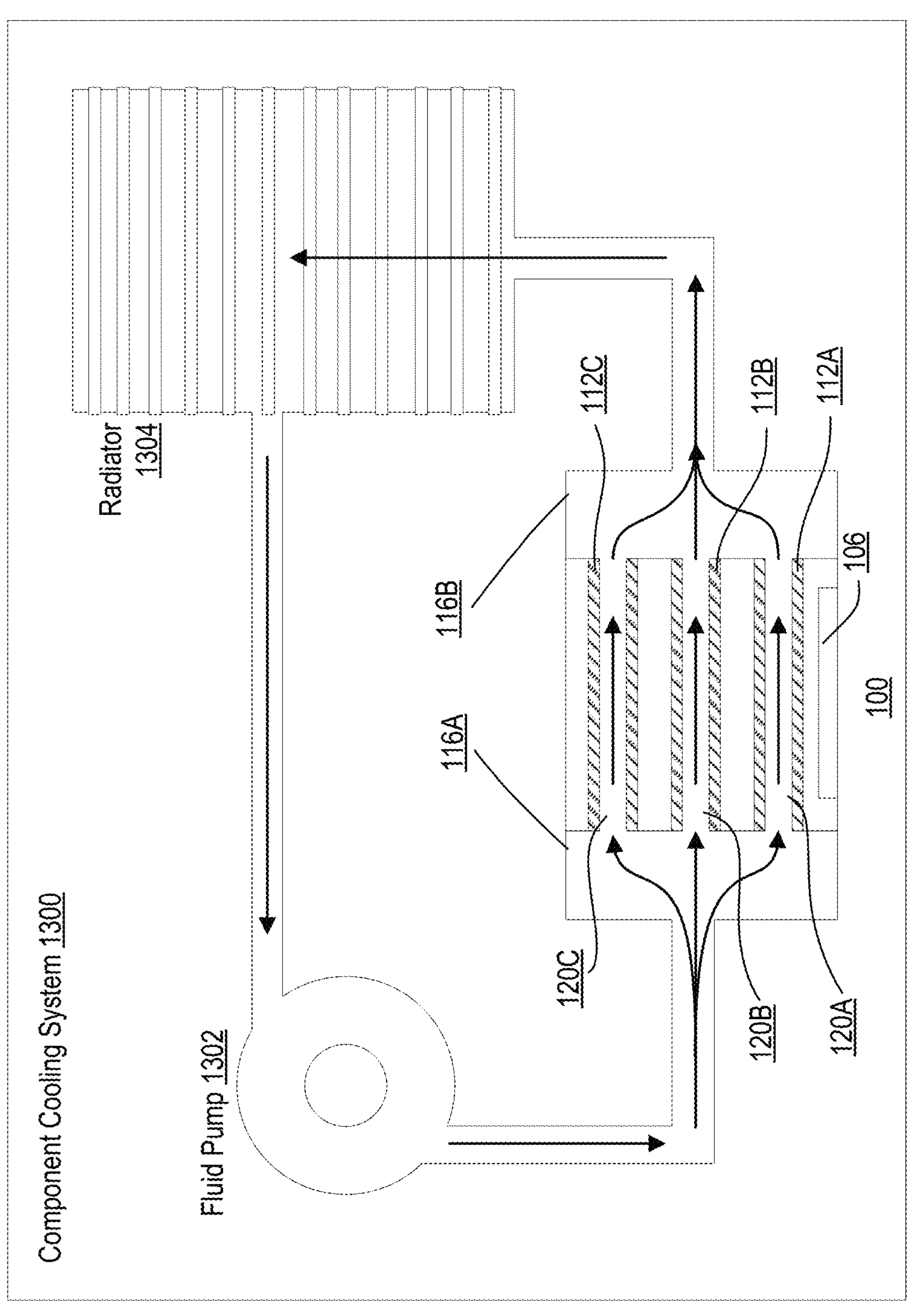
FIG. 13 is another example component cooling apparatus according to some implementations of the present disclosure.

FIG. 13 is a block diagram of an example component cooling system 1300 for a computing device according to some implementations. The example component cooling system 1300 includes a fluid pump 1302, a radiator 1304, and the component cooling apparatus 100. During operation of the component cooling system 1300, the fluid pump 1302 pumps a heat transfer medium, such as a heat transfer fluid, to the manifold inlet portion 116A via tubing or the like. The manifold inlet portion 116A splits the heat transfer fluid into separate flows, with each separate flow directed to one of the first fluid passage 120A, the second fluid passage 120B, and the third fluid passage 120C. The first fluid passage 120A extends from the manifold inlet portion 116A to the manifold outlet portion 116B and is in thermal contact with the first cold plate 112A. Heat from the first cold plate 112A is transferred to the fluid flowing through the first fluid passage 120A.

The second fluid passage 120B extends from the manifold inlet portion 116A to the manifold outlet portion 116B and is in thermal contact with the second cold plate 112B. Heat from the second cold plate 112B is transferred to the fluid flowing through the second fluid passage 120B.

The third fluid passage 120C extends from the manifold inlet portion 116A to the manifold outlet portion 116B and is in thermal contact with the third cold plate 112C. Heat from the third cold plate 112C is transferred to the fluid flowing through the third fluid passage 120C.

Each of the separate fluid flows exits through an outlet of the cold plate through which the fluid flowed. Upon exiting the cold plates, the separate flows, each carrying heat transferred from their respect fluid flow passage, are merged into a single merged flow within the manifold outlet portion 116B. The single merged flow is output from the manifold outlet portion 116B to the radiator 1304 via tubing or the like.

The radiator 1304 is configured to dissipate a portion of the heat contained with the heat transfer fluid of the single merged flow and return the fluid flow cooled fluid to the fluid pump 1302 for further circulation through the system. In some implementations, the radiator 1304 also includes or is coupled to one or more cooling fans to facilitate the dissipation of the heat contained within the heat transfer fluid. Although the implementation of FIG. 13 shows a single radiator, multiple radiators may be used as well.

In some variations of the system of FIG. 13, the flows received from the first fluid passage 120A, the second fluid passage 120B, and the third fluid passage 120C are not merged within the fluid manifold, but are instead each provided to separate radiators or other heat dissipating devices. In such an example, the flows are merged after passing through the radiators.

Figure 14:
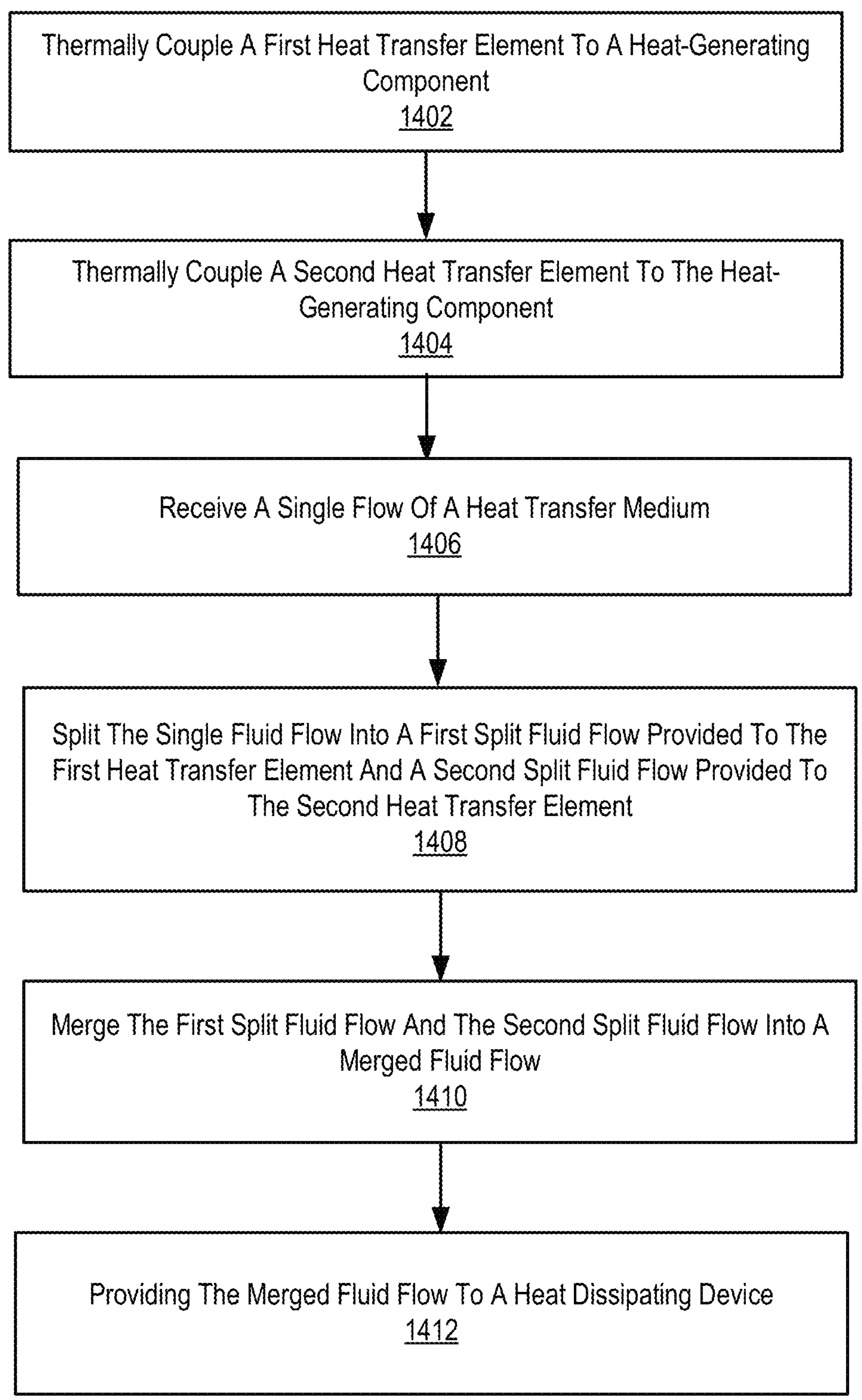
FIG. 14 sets forth a flow chart illustrating an example method for component cooling according to some implementations.

For further explanation, FIG. 14 sets forth a flow chart illustrating an example method for component cooling according to some implementations. In an implementation, the method includes thermally coupling 1402 a first heat transfer element to a heat-generating component. The method further includes thermally coupling 1404 a second heat transfer element to the heat-generating component. The method further includes receiving 1406 a single fluid flow of a heat transfer medium. The method further includes splitting 1408 the single fluid flow into a first split fluid flow provided to the first heat transfer element and a second split fluid flow provided to the second heat transfer element. In an implementation, the method further includes controlling a flow rate of the first split fluid flow and the second split fluid flow.

In an implementation, the method further includes merging 1410 the first split fluid flow and the second split fluid flow into a merged fluid flow. The method also includes providing 1412 the merged fluid flow to a heat dissipating device such as a radiator.

Exemplary implementations of the present disclosure are described largely in the context of a fully functional computer system for a component cooler for computing devices. Readers of skill in the art will recognize, however, that the present disclosure also can be embodied in a computer program product disposed upon computer readable storage media for use with any suitable data processing system. Such computer readable storage media can be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the disclosure as embodied in a computer program product. Persons skilled in the art will also recognize that, although some of the exemplary implementations described in this specification are oriented to software installed and executing on computer hardware, nevertheless, alternative implementations implemented as firmware or as hardware are well within the scope of the present disclosure.

The present disclosure can be a system, a method, and/or a computer program product. The computer program product can include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some implementations, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to implementations of the disclosure. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various implementations of the present disclosure. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. An apparatus for component cooling, the apparatus comprising:

a first heat transfer element configured to be thermally coupled to a heat-generating component, wherein the first heat transfer element comprises a first cold plate;

a second heat transfer element configured to be thermally coupled to the heat-generating component, wherein the second heat transfer element comprises a second cold plate separate from the first cold plate, wherein the first cold plate and the second cold plate each comprise a respective fluid passage extending therethrough;

a heat transfer structure thermally coupled between the first heat transfer element and the second heat transfer element and configured to provide a heat conduction path from the first heat transfer element to the second heat transfer element; and a manifold configured to receive a single fluid flow of a heat transfer medium and split the single fluid flow into a first split fluid flow provided to the first heat transfer element and a second split fluid flow provided to the second heat transfer element.

2. The apparatus of claim 1, wherein the manifold is further configured to merge the first split fluid flow and the second split fluid flow into a merged fluid flow after the first split fluid flow exits the first heat transfer element and the second split fluid flow exits the second heat transfer element.

3. The apparatus of claim 2, wherein the manifold is further configured to provide the merged fluid flow to a heat dissipating device.

4. The apparatus of claim 2, further comprising:

a third heat transfer element configured to be thermally coupled to the heat-generating component, wherein the manifold is further configured to split the single fluid flow into a third split fluid flow provided to the third heat transfer element and merge the third split fluid flow into the merged fluid flow after the third split fluid flow exits the third heat transfer element.

5. The apparatus of claim 4, wherein a flow rate of the first split fluid flow is different than a flow rate of the second split fluid flow and different than a flow rate of the third split fluid flow.

6. The apparatus of claim 1, wherein the manifold further comprises:

a first fluid passage providing the first split fluid flow through the first heat transfer element; and a second fluid passage providing the second split fluid flow through the second heat transfer element.

7. The apparatus of claim 6, wherein an interior diameter of the first fluid passage is greater than an interior diameter of the second fluid passage, resulting in a flow rate of the first split fluid flow through the first fluid passage being lower than a flow rate of the second split fluid flow through the second fluid passage.

8. The apparatus of claim 6, wherein the first fluid passage includes a first valve configured to control a flow rate of the first split fluid flow, and the second fluid passage includes a second valve configured to control a flow rate of the second split fluid flow.

9. The apparatus of claim 8, wherein the first valve and the second valve are configured to be adjusted dynamically, during operation of the apparatus.

10. The apparatus of claim 1, further comprising a plurality of heat transfer structures thermally coupled between the first heat transfer element and the second heat transfer element, each of the plurality of heat transfer structures configured to provide a separate heat conduction path from the first heat transfer element to the second heat transfer element.

11. The apparatus of claim 10, wherein the plurality of heat transfer structures includes at least one heat pipe.

12. The apparatus of claim 1, wherein the first heat transfer element includes a first base plate.

13. The apparatus of claim 1, wherein the second heat transfer element includes a second base plate.

14. The apparatus of claim 1, further comprising a first thermoelectric cooler thermally coupled to the first heat transfer element.

15. The apparatus of claim 14, further comprising a second thermoelectric cooler thermally coupled to the second heat transfer element.

16. The apparatus of claim 14, wherein the manifold comprises a valve configured to control a flow rate of at least one of the first split fluid flow and the second split fluid flow.

17. A component cooling assembly comprising:

an integrated circuit;

a first heat transfer element thermally coupled to the integrated circuit, wherein the first heat transfer element comprises a first cold plate;

a second heat transfer element thermally coupled to the integrated circuit, wherein the second heat transfer element comprises a second cold plate separate from the first cold plate, wherein the first cold plate and the second cold plate each comprise a respective fluid passage extending therethrough;

a heat transfer structure thermally coupled between the first heat transfer element and the second heat transfer element and configured to provide a heat conduction path from the first heat transfer element to the second heat transfer element; and a manifold configured to receive a single fluid flow of a heat transfer medium and split the single fluid flow into a first split fluid flow provided to the first heat transfer element and a second split fluid flow provided to the second heat transfer element.

18. The component cooling assembly of claim 17, wherein the manifold is further configured to merge the first split fluid flow and the second split fluid flow into a merged fluid flow after the first split fluid flow exits the first heat transfer element and the second split fluid flow exits the second heat transfer element.

19. The component cooling assembly of claim 17, wherein the manifold comprises a valve configured to control a flow rate of at least one of the first split fluid flow and the second split fluid flow.

20. A manifold for a component cooling apparatus, the manifold comprising:

a manifold inlet configured to receive a single fluid flow of a heat transfer medium;

a first fluid passage and a second fluid passage configured to split the single fluid flow into a first split fluid flow and a second split fluid flow, the first fluid passage adapted to carry the first split fluid flow to an inlet of a first cold plate, the second fluid passage adapted to carry the second split fluid flow to an inlet of a second cold plate separate from the first cold plate, wherein the first cold plate and the second cold plate each comprise a respective fluid passage extending therethrough;

multiple spring mechanisms coupled to the manifold and to each of the first cold plate and the second cold plate, wherein the spring mechanisms are configured to exert a force against the first cold plate and the second cold plate; and a manifold outlet configured to:

receive the first split fluid flow from an outlet of the first cold plate;

receive the second split fluid flow from an outlet of the second cold plate; and merge the first split fluid flow and the second split fluid flow into a merged fluid flow.

* * * * *